United States Patent [19]
Bass et al.

[11] Patent Number: 4,575,674
[45] Date of Patent: Mar. 11, 1986

[54] MACROCELL ARRAY HAVING REAL TIME DIAGNOSTICS

[75] Inventors: Alan S. Bass; Shi-Chuan Lee, both of Mesa, Ariz.

[73] Assignee: Motorola, Inc., Schaumburg, Ill.

[21] Appl. No.: 510,028

[22] Filed: Jul. 1, 1983

[51] Int. Cl.$^4$ .......................................... G01R 31/28
[52] U.S. Cl. ..................................... 324/73 R; 371/25
[58] Field of Search ............ 324/158 R, 73 R, 73 AT; 377/70, 73; 371/20, 21, 25

[56] References Cited

U.S. PATENT DOCUMENTS

| | | | |
|---|---|---|---|
| 4,139,818 | 2/1979 | Schneider | 324/73 AT X |
| 4,225,957 | 9/1980 | Doty, Jr. et al. | 324/73 R X |
| 4,277,699 | 7/1981 | Brown et al. | 377/73 X |
| 4,435,806 | 3/1984 | Segers et al. | 324/73 R X |
| 4,441,074 | 4/1984 | Bockett-Pugh et al. | 324/73 R |
| 4,477,902 | 10/1984 | Puri et al. | 324/73 R X |
| 4,503,387 | 3/1985 | Rutledge et al. | 324/73 R |
| 4,503,536 | 3/1985 | Panzer | 324/73 R X |
| 4,503,537 | 3/1985 | McAnney | 324/73 R X |
| 4,504,784 | 3/1985 | Goel et al. | 324/73 R |

OTHER PUBLICATIONS

Dasgupta, S., et al., "Set-Reset Shift Register Latch . . . ", IBM Technical Disclosure Bulletin, vol. 18, No. 10, Mar. 1976, p. 3258.

Dasgupta, S., "LSSD Scan Technique", IBM Technical Disclosure Bulletin, vol. 24, No. 8, Jan. 1982, p. 4425.
Siegel, M., "LSSD Design Multiple Scan Paths", IBM Technical Disclosure Bulletin, vol. 24, No. 8, Jan. 1982, pp. 4426-4427.

Primary Examiner—Stewart J. Levy
Assistant Examiner—Stephen M. Baker
Attorney, Agent, or Firm—William E. Koch

[57] ABSTRACT

A macrocell array is provided wherein a plurality of cells, each having a plurality of semiconductor devices interconnected for providing logic functions, are selectively interconnected to one another and to input/output pads by a plurality of horizontal and vertical routing channels in one or more metallization layers. An on-chip diagnostic circuit is provided for diagnosing a plurality of serially connected latches, or flip-flops, in real time. A first logic gate has inputs adapted to receive a data signal and a data enable signal for inputting data into the latches. A second logic gate has inputs adapted to receive a shift-data-in signal and a shift enable signal for shifting the data through the latches. A third logic gate has inputs adapted to receive a hold signal and an output of a first of the plurality of serially connected latches for capturing the states in each of the latches at a given time. A fourth logic gate has inputs adapted to receive a complement enable signal and an output of the first latch for allowing desired test data to simultaneously appear at all the latches under test.

5 Claims, 2 Drawing Figures

MACROCELL ARRAY HAVING REAL TIME DIAGNOSTICS

BACKGROUND OF THE INVENTION

1. Field of the Invention

This invention relates in general to macrocell arrays and, more particularly, to a multi-gate bipolar macrocell array having real time diagnostics.

2. Background Art

To satisfy the demand for large scale digital integrated circuits, the semiconductor industry has developed three basic approaches. These include standard, off the shelf circuits; custom circuits; and gate arrays. The standard, off the shelf circuit provides the lowest cost option due to the quantities manufactured, but are limited in providing the flexibility for the circuit desired. The custom circuit is cost limiting unless the number of circuits desired is large. The gate array involves a standard array of a large number of gate circuits diffused into a chip. The metallization pattern converting these gate circuits into functional custom circuits is processed according to the customer's requirement.

A macrocell array is an extension of the gate array concept. A macrocell is an array subsection performing a higher level logic function than a basic gate. A macrocell array is an array circuit in which macro functions used to define logic simulations are directly implemented within the basic cell structure rather than formed by interconnecting logic gates. Each cell in a macrocell array contains a number of unconnected transistors and resistors. A metallization interconnecting pattern transforms the interconnected transistors and resistors within each cell into Small Scale Integrated (SSI) logic functions, called macros. The macros take the form of standard logic elements such as dual type "D" flip-flops, dual full adders, quad latches, and many other predefined functions. The macros are also interconnected by the metallization to form the desired Large Scale Integrated (LSI) design. The high density packing of a macrocell array chip offers up to a fifty to one reduction in system component count, with a power dissipation improvement of as much as five to one. However, the previously known macrocell arrays have drawbacks that have presented problems for both the designer and the end user.

A typical macrocell array has input cells for receiving an input and for logic functions, output cells for providing an output and for logic functions, major cells for receiving an input and for logic functions, bias generator cells providing bias voltages, and clock generator cells for providing clock pulses. Only the bias generator cells would not be connected to an input/output pad.

Previously known macrocell arrays have included diagnostic circuits comprising a first NAND gate responsive to a data signal and a data enable signal, and a second NAND gate responsive to a shift-data-in signal and a shift enable signal. The outputs of the first and second NAND gates are coupled to an OR gate. The output of the OR gate drives a flip-flop or latch. An output of the flip-flop would serve as the shift-data-in signal to a number of serially connected diagnostic circuits. However, these previously known diagnostic circuits did not provide the capability of performing real time diagnostics. The state of serially connected flip-flops or latch could only be tested by shifting test data through the system with the system clock stopped.

Thus, what is needed is a macrocell array having real time diagnostics.

SUMMARY OF THE INVENTION

Accordingly, it is an object of the present invention to provide an improved macrocell array.

Another object of the present invention is to provide a macrocell array having real time diagnostics.

In carrying out the above and other objects of the invention in one form, there is provided a macrocell array having a plurality of cells, each of said cells having a plurality of semiconductor devices. The semiconductor devices are interconnected within each cell to provide logic functions. A plurality of horizontal routing channels within one or more metallization layers are connected to input/output points of the logic functions within and between each cell. A plurality of vertical routing channels within the metallization layers are coupled between the horizontal routing channels and input/output pads.

A diagnostic circuit is provided for diagnosing a plurality of serially connected flip-flops in real time. A first logic gate has inputs adapted to receive a data signal and a data enable signal for inputting data into the flip-flops. A second logic gate has inputs adapted to receive a shift data in signal and a shift enable signal for shifting the data through the flip-flops. A third logic gate has inputs adapted to receive a hold signal and an output of a first of the plurality of serially connected flip-flops for capturing the states in each of the flip-flops at a given time. A fourth logic gate has inputs adapted to receive a complement enable signal and an output of the first flip-flop for allowing desired test data to simultaneously appear at all the flip-flops under test. A fifth logic gate is coupled between the first flip-flop and each of the first through the fourth logic gates and is responsive to the output of the first through the fourth logic gates.

The above and other objects, features, and advantages of the present invention will be better understood from the following detailed description taken in conjunction with the accompanying drawings.

DETAILED DESCRIPTION OF THE INVENTION

Figure 1:
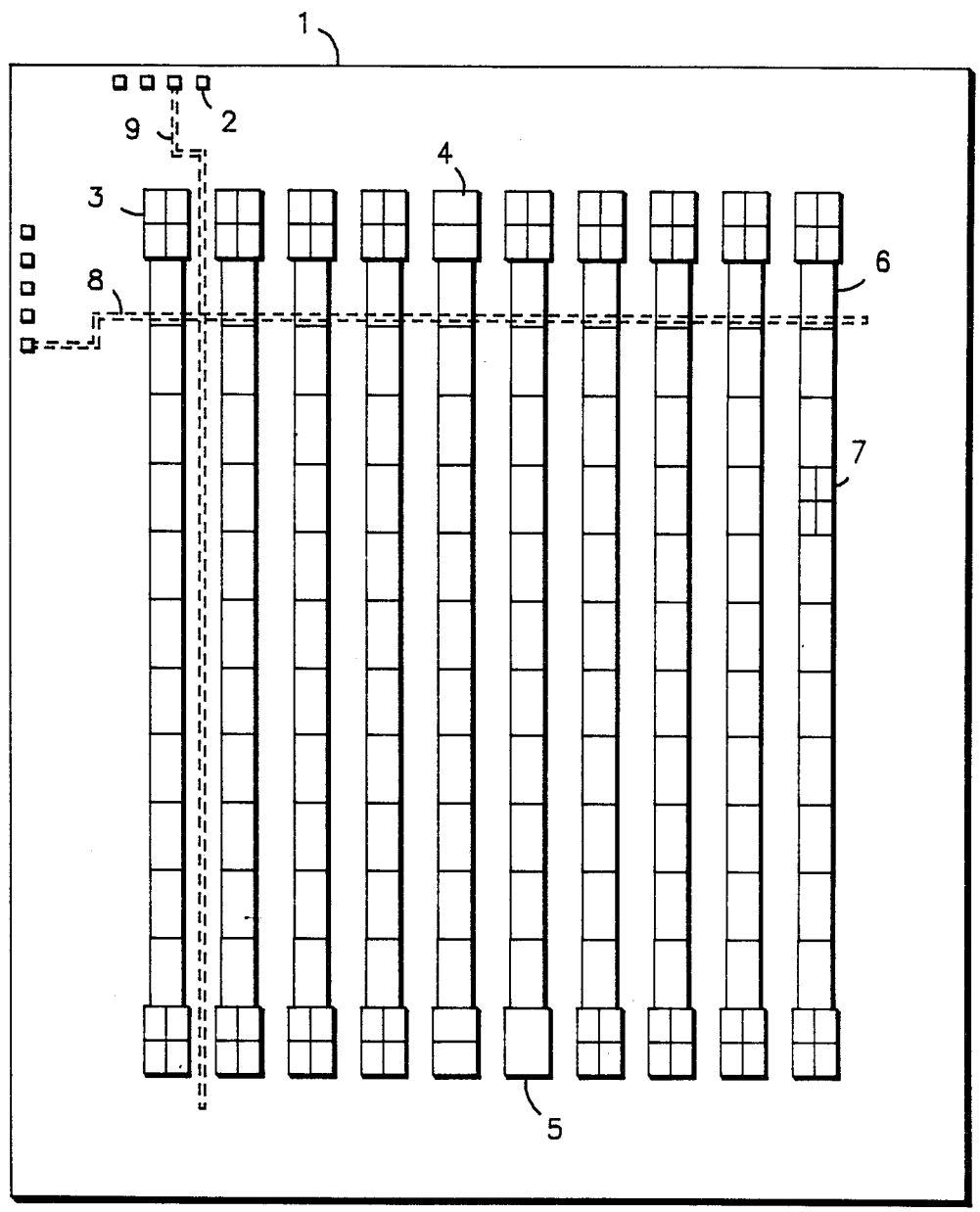
FIG. 1 is a diagram of the layout of a macrocell array.

FIG. 1 shows a macrocell array comprising a silicon semiconductor substrate 1 having input/output pads 2, output cells 3, bias generator cells 4, clock generator cell 5, and major cells 6. Routing channels within metallization layers (not shown) interconnect any of the cells to one another and to input/output pads 2 in a manner determined by the logic desired. Cells 3, 4, 5, 6 are in horizontal proximity; however, no actual electrical contact is established between cells until metallization. Each cell contains a plurality of semiconductor devices which may be connected by the metallization layer in a way to provide certain functions. Each cell may be further divided into two or more logic units 7.

Three metallization layers (not shown) are utilized wherein the first two layers interconnect macros and the third layer interconnects power bussing in a manner known to those skilled in the art. Horizontal routing channels 8 within the metallization layers connect any of the cells to one another and to input/output pads 2, if required, in a manner determined by the logic desired. Although only one horizontal routing channel 8 is shown, as many as thirty may cross each horizontal row of cells.

Vertical routing channels 9 within the metallization layers weave between and across horizontal routing channels 8 connecting therewith for providing a desired logic. Vertical routing channels 9 do not pass over the cells but are located between each vertical column of cells. Although only one verticle routing channel 9 is shown, the actual number will be larger and will vary depending on each chip's requirements.

Figure 2:
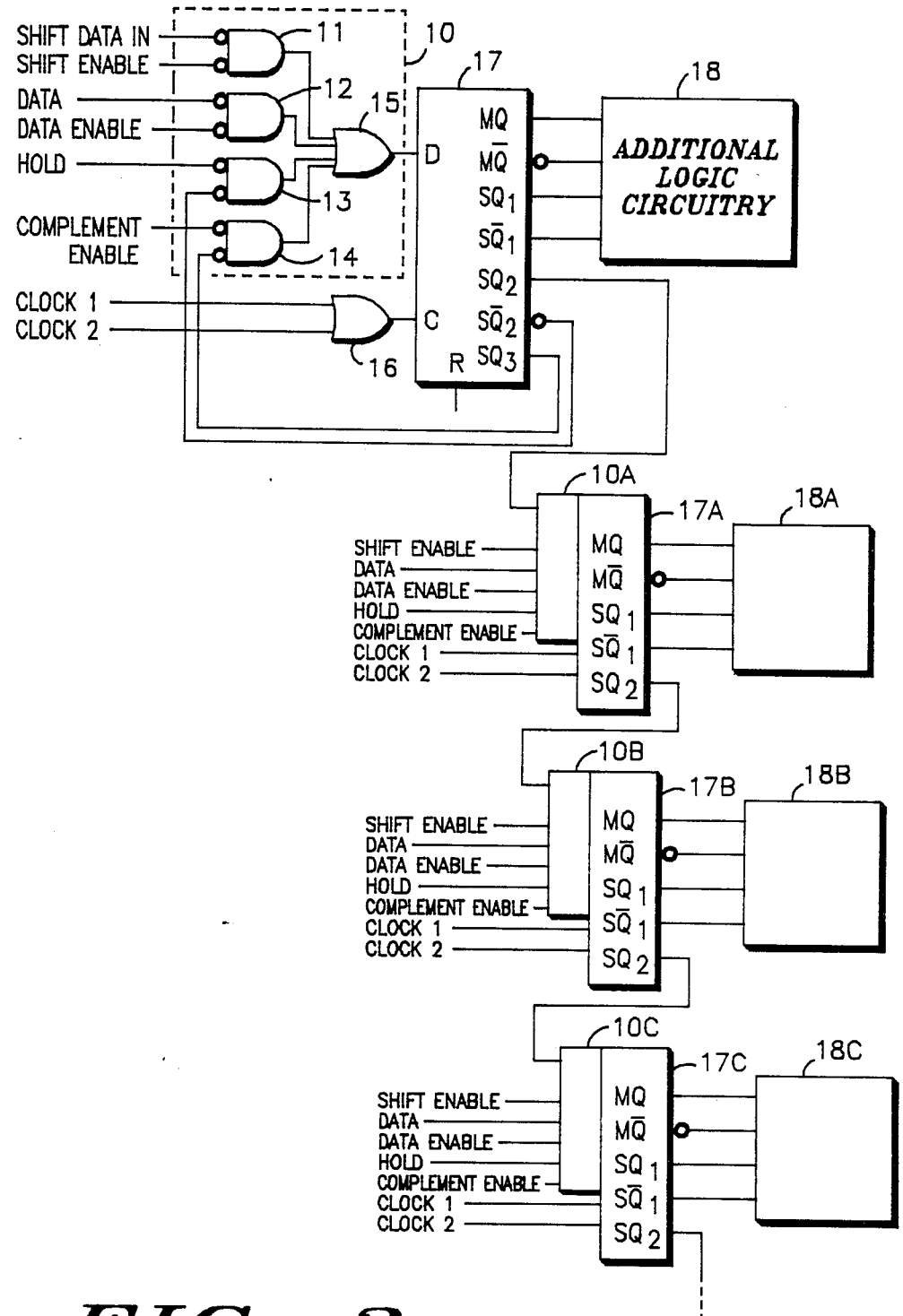
FIG. 2 illustrates a preferred embodiment of the present invention.

FIG. 2 shows the diagnostic circuit 10 that may be included in any one of the major cells 6. AND gate 11 has two inverted inputs responsive to a shift-data-in signal and shift enable signal. AND gate 12 has two inverted inputs responsive to a data signal and data enable signal. AND gate 13 has an inverted input responsive to a hold signal. AND gate 14 has an inverted input responsive to a complement enable signal. Outputs from AND gates 11, 12, 13, 14 are connected as inputs to OR gate 15. OR gate 16 has two inputs responsive to a first clock signal and a second clock signal. The output of OR gate 15 is connected to input D of flip-flop 17. The output of OR gate 16 is connected to input C of flip-flop 17. Outputs from flip-flop 17, for example, include master output $MQ$ and $\overline{MQ}$, slave outputs $SQ_1$, $SQ_2$, $SQ_3$, $\overline{SQ_1}$, $\overline{SQ_2}$. Outputs $SQ_1$, $SQ_2$ and $SQ_3$ are the same signal, but are shown separately for simplicity and outputs $\overline{SQ_1}$ and $\overline{SQ_2}$ are the same signal, but are shown separately for simplicity. Outputs $MQ$, $\overline{MQ}$, $SQ$, $\overline{SQ_1}$ are connected to additional logic circuitry 18. Logic circuitry 18 is illustrated in block diagram form since the function thereof is not pertinent to the invention described herein. Additional, or fewer, outputs from flip-flop 17 may be required, depending on the function of additional logic circuitry 18. Slave output $\overline{SQ_2}$ is inverted and connected to an inverted input to gate 13. Output $SQ_3$ is connected as an inverted input to gate 14.

Output $SQ_2$ is connected to diagnostic circuit 10A as the shift-data-in input. Each diagnostic circuit 10A, 10B, 10C and flip-flops 17A, 17B, 17C are similar and have inputs and outputs similar to diagnostic circuit 10 and flip-flop 17. Outputs $MQ$, $\overline{MQ}$, $SQ_1$, $\overline{SQ_1}$, of flip-flops 17A, 17B, 17C are each connected to additional logic circuitry 18A, 18B, 18C respectively. Output $SQ_2$ of flip-flop 17A, 17B are each connected to diagnostic circuit 10B, 10C, respectively, as shift-data-in inputs. Output $SQ_2$ of flip-flop 17C may be connected to a fourth diagnostic circuit (not shown) and so on. The number of diagnostic circuits 10 and flip flops 17 serially connected in this manner depends upon the logic function implemented. Although the inputs to each of diagnostic circuits 10, 10A, 10B, 10C are illustrated as unique inputs, the shift enable inputs of each may be interconnected. Likewise, the data enable, hold, and complement enable inputs may each be interconnected. Clock 1 and clock 2 inputs to OR gate 16 may likewise be interconnected. The shift-data-in and data inputs would be unique to each diagnostic circuit 10, 10A, 10B, 10C.

The hold signal input allows the capture of the states of the flip-flops at any given time, and operates independently of the system clock. The complement enable input facilitates AC testing of the chip, as it makes it possible for desired test data to simultaneously appear at all flip-flops under test. The flip-flop 17 is understood to be a latch and is not to be limited as a flip-flop in the typical sense.

In operation, when the data enable input allows, data may be entered in each diagnostic circuit 10 as desired. In the absense of the shift enable, data enable, and complement enable inputs, a hold input will capture the state of the flip-flop 17 since the $\overline{SQ_2}$ output is NANDed with the hold input in NAND gate 13.

Then, when the shift enable input allows and with a shift-data in input, the data in each flip-flop 17 may be shifted through each of the serially connected flip-flops 17, 17A, 17B, 17C to an output pin (not shown), thereby giving a serial readout of the data in each of the flip-flops 17 at the time of the hold input. The complement enable input is NANDed with the $SQ_3$ output in NAND gate 14 and inverts the state of the flip-flop 17.

The clock 1 and clock 2 inputs clock the flip-flop 17 in the typical manner known to those skilled in the art.

By now it should be appreciated that there has been provided a macrocell array having real time diagnostics capable of diagnosing a plurality of serially connected latches which form a portion of the operating circuit of the macrocell array.

We claim:

1. A macrocell array comprising:
   a plurality of cells, each of said cells having a plurality of semiconductor devices, said semiconductor devices being interconnected within each cell to provide logic functions;
   a plurality of input/output pads, each adapted to receive an input signal having a data input;
   a plurality of horizontal routing channels within one or more metallization layers overlying said cells, said horizontal routing channels being coupled to said plurality of semiconductor devices at selected input/output points of said logic functions;
   a plurality of vertical routing channels within said one or more metallization layers overlying said cells, said vertical routing channels coupled to said horizontal routing channels and said input/output pads;
   a plurality of serially connected latches within one of said cells, said latches being clocked by a system clock; and
   a plurality of diagnostic means for performing both AC and DC tests, one each coupled to one each of said plurality of serially connected latches, each of said diagnostic means including feedback for facilitating AC testing at each clock pulse and a hold means for capturing the states of said plurality of serially connected latches independent of said system clock.

2. The macrocell array according to claim 1 wherein said diagnostic means further includes a complement enable means responsive to said feedback for having test data simultaneously appear at each of said plurality of serially connected latches.

3. The macrocell array according to claim 1 wherein each of said diagnostic means comprises a first logic gate having a first input adapted to receive a hold signal and a second input coupled to a first output of one of said plurality of serially connected latches and having an output coupled to said one of said plurality of serially connected latches.

4. The macrocell array according to claim 2 wherein said complement enable means includes a second logic gate having a first input adapted to receive a complement enable signal and a second input coupled to receive said feedback and having an output coupled to said one each of said plurality of serially connected latches.

5. A diagnostic circuit for diagnosing in real time a plurality of serially connected latches, each of said plurality of serially connected latches having a first output and a second output and having one of said diagnostic circuits connected thereto, said diagnostic circuit comprising:

a data logic gate having a first input adapted to receive a data signal and a second input adapted to receive a data enable signal and having a data output;

a shift-data-in logic gate having a first input adapted to receive a shift-data-in signal and a second input adapted to receive a shift enable signal and having a shift data output;

a hold logic gate having a first input adapted to receive a hold signal and a second input adapted to receive said first output and having a hold output;

a complement enable logic gate having a first input adapted to receive a complement enable signal and a second input adapted to receive said second output and having a complement enable output; and a further logic gate coupled between said one of said plurality of serially connected latches and each of said data logic gate, and shift-data-in logic gate, said hold logic gate, and said complement enable logic gate, and adapted to receive said data output, said shift data output, said hold output, and said complement enable output, wherein said second output of said latch is provided as said shift-data-in signal for another diagnostic circuit connected to another of said serially connected latches.

* * * * *